United States Patent
Katagiri et al.

(10) Patent No.: US 7,211,528 B2
(45) Date of Patent: May 1, 2007

(54) RESIN-IMPREGNATED SUBSTRATE

(75) Inventors: Shiro Katagiri, Tsukuba (JP); Satoshi Okamoto, Tsukuba (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 85 days.

(21) Appl. No.: 11/150,281

(22) Filed: Jun. 13, 2005

(65) Prior Publication Data
US 2005/0276975 A1    Dec. 15, 2005

(30) Foreign Application Priority Data
Jun. 15, 2004    (JP) ............................. 2004-176521

(51) Int. Cl.
*B32B 5/02* (2006.01)
*B32B 27/02* (2006.01)

(52) U.S. Cl. ....................... 442/117; 442/110; 442/136; 442/164

(58) Field of Classification Search ................ 442/117, 442/110, 136, 164
See application file for complete search history.

(56) References Cited

U.S. PATENT DOCUMENTS 5,646,209 A * 7/1997 Furuta et al. ................ 524/252

2004/0210032 A1    10/2004    Okamoto et al.

FOREIGN PATENT DOCUMENTS

JP    05-08224 A    1/1993

OTHER PUBLICATIONS

U.S. Appl. No. 11/028,654, filed Jan. 5, 2005.

* cited by examiner

*Primary Examiner*—Lynda M. Salvatore
(74) *Attorney, Agent, or Firm*—Sughrue Mion, PLLC

(57) ABSTRACT

A resin-impregnated substrate having a high heat resistance at a high temperature under soldering conditions and a small linear expansion rate is provided. The resin-impregnated substrate can be obtained by a method comprising the steps of immersing a sheet comprising an aromatic liquid-crystalline polyester fiber in an aromatic liquid-crystalline polyester solution containing an aprotonic solvent and a liquid-crystalline polyester comprising 10 to 35% by mol, with respect to the total repeating units of the polyester, of at least one repeating unit selected from the group consisting of a repeating unit derived from an aromatic diamine and a repeating unit derived from an aromatic amine with a phenolic hydroxyl group; and removing the solvent.

4 Claims, No Drawings

RESIN-IMPREGNATED SUBSTRATE

BACKGROUND OF THE INVENTION

1. Field of the Invention

The present invention relates to a resin-impregnated substrate.

2. Description of the Related Art

Recently, it is desired to develop an insulating resin substrate excellent in characteristics such as heat resistance, low moisture absorption, dimensional stability and dielectric properties at high frequency, the substrate being used with a conductive layer thereon in electronic and electric equipment fields.

A conventionally known insulating resin substrate is a resin-impregnated substrate which is produced by impregnating glass cross with an epoxy resin (see, Japanese Unexamined Patent Application Publication No. 5-8224).

However, such a resin-impregnated substrate produced by impregnating glass cross with an epoxy resin is insufficient in heat resistance, while the substrate is often used with a lead-free solder which needs a higher temperature in soldering (for example, a temperature of 260° C. or higher). For example, the immersion of the resin-impregnated substrate in a solder bath at a temperature of 260° C. or higher may cause heat deterioration of the epoxy resin, which may result in distortion of the resin-impregnated substrate in some cases. Accordingly, a resin-impregnated substrate having a high heat resistance at such a high temperature under soldering conditions has been demanded.

In addition, the conventional resin-impregnated substrate tends to have a relatively large linear expansion rate. Therefore, when the resin-impregnated substrate is utilized with a conductive layer thereon in the applications of a printed circuit board and a package substrate, the difference in a linear expansion rate between the substrate and the conductive layer is remarkable in some cases. In such cases, warpage of the substrate with the conductive layer may occur when an IC chip is actually mounted thereon. Accordingly, a resin-impregnated substrate having a small linear expansion rate has also been demanded.

SUMMARY OF THE INVENTION

One of objects of the present invention is to provide a resin-impregnated substrate having a high heat resistance (solder heat resistant) at a high temperature under soldering conditions and a small linear expansion rate.

The present invention provides a resin-impregnated substrate obtainable by a method comprising the steps of:

immersing a sheet comprising an aromatic liquid-crystalline polyester fiber in an aromatic liquid-crystalline polyester solution containing an aprotonic solvent and a liquid-crystalline polyester comprising 10 to 35% by mol, with respect to the total repeating units of the polyester, of at least one repeating unit selected from the group consisting of a repeating unit derived from an aromatic diamine and a repeating unit derived from an aromatic amine with a phenolic hydroxyl group; and removing the solvent.

Also, the present invention provides a resin-impregnated substrate with a conductive layer, which comprises the above-mentioned resin-impregnated substrate and at least one conductive layer placed on at least one side of the substrate.

According to the present invention, a resin-impregnated substrate having a high solder heat resistance and a small linear expansion rate is provided.

DESCRIPTION OF THE PREFERRED EMBODIMENTS

An aromatic liquid-crystalline polyester solution used in the present invention contains an aprotonic solvent and a liquid-crystalline polyester comprising 10 to 35% by mol, with respect to the total repeating units of the polyester, of at least one repeating unit selected from the group consisting of a repeating unit derived from an aromatic diamine and a repeating unit derived from an aromatic amine with a phenolic hydroxyl group.

The liquid-crystalline polyester contained in the aromatic liquid-crystalline polyester solution is the polyester which may exhibit optical anisotropy in melting, and may generate an anisotropic melt at a temperature of 450° C. or lower.

Preferable liquid-crystalline polyesters comprises repeating units represented by the following formulas (1), (2) and (3). The amounts of the repeating units represented by formulas (1), (2) and (3) are preferably in the range of from 30 to 80% by mol, in the range of from 35 to 10% by mol and in the range of from 35 to 10% by mol, respectively in the polyester:

  (1)

  (2)

  (3)

In the above formulae, $Ar_1$ represents 1,4-phenylene, 2,6-naphthalene or 4,4'-biphenylene; $Ar_2$ represents 1,4-phenylene, 1,3-phenylene or 2,6-naphthalene; $Ar_3$ represents 1,4-phenylene or 1,3-phenylene; X represents —NH—; and Y represents —O— or NH—.

The repeating unit (1) is a repeating unit derived from aromatic hydroxycarboxylic acid, the repeating unit (2) is a repeating unit derived from aromatic dicarboxylic acid, the repeating unit (3) is a repeating unit derived from aromatic diamine or aromatic amine having a phenolic hydroxy group. Instead of using the aromatic hydroxycarboxylic acid, aromatic dicarboxylic acid, aromatic diamine or aromatic amine having a phenolic hydroxyl group, the preferable liquid-crystalline polyesters may be produced by using the ester- or amide-forming derivative corresponding thereto.

The ester-forming derivative of the aromatic hydroxycarboxylic acid or the aromatic dicarboxylic acid may be a highly reactive derivative such as a chloride or anhydride thereof, or an ester of the aromatic hydroxycarboxylic acid or the aromatic dicarboxylic acid with an alcohol or ethylene glycol which can form a polyester by transesterification.

The ester-forming derivative of the aromatic amine having a phenolic hydroxyl group may be an aromatic amine, the phenolic hydroxyl group of which forms an ester with a carboxylic acid which can form a polyester by a transesterification.

The amide-forming derivative of the aromatic diamine or aromatic amine having a phenolic hydroxyl group may be an aromatic diamine or aromatic amine, the amino group of which forms an amide with a carboxylic acid which can form a polyamide by a transamidation.

Examples of the repeating units of the liquid-crystalline polyester used in the present invention include the following repeating units.

Examples of the repeating unit represented by formula (1) include repeating units derived from p-hydroxybenzoic acid, 2-hydroxy-6-naphthoic acid, and 4-hydroxy-4'-biphenylcarboxylic acid. Two or more of the aforementioned repeating units may be included in the liquid-crystalline polyester. Among these repeating units, a preferable repeating unit is the repeating unit derived from 2-hydroxy-6-naphthoic acid.

The amount of the repeating unit (1) in the liquid-crystalline polyester may be in the range of from 30 to 80% by mol, is preferably from 40 to 70% by mol, and is more preferably from 45 to 65% by mol, with respect to the total repeating units of the polyester. When the amount of the repeating unit (1) is larger than the above upper limit, the solubility of the polyester in the solvent described later tends to decrease. When the amount of the repeating unit (1) is smaller than the above lower limit, it may be difficult for the polyester to exhibit liquid crystallinity.

Examples of the repeating unit represented by formula (2) include repeating units derived from terephthalic acid, isophthalic acid and 2,6-naphthalenedicarboxylic acid. Two or more of the aforementioned repeating units may be included in the liquid-crystalline polyester. Among these repeating units, a preferable repeating unit is the repeating unit derived from isophthalic acid from a viewpoint of solubility of the polyester in the solvent described later.

The amount of the repeating unit (2) in the liquid-crystalline polyester may be in the range of from 35 to 10% by mol, is preferably from 30 to 15% by mol, and is more preferably from 27.5 to 17.5% by mol, with respect to the total repeating units of the polyester. When the amount of the repeating unit (2) is larger than the above upper limit, the liquid crystallinity of the polyester tends to decrease. When the amount of the repeating unit (2) is smaller than the above lower limit, the solubility of the polyester in the solvent described later tends to decrease.

Examples of a repeating unit represented by formula (3) include repeating units derived from 3-aminophenol, 4-aminophenol, 1,4-phenylenediamine and 1,3-phenylenediamine. Two or more of the aforementioned repeating units may be included in the liquid-crystalline polyester. Among these repeating units, a preferable repeating unit is the repeating unit derived from 4-aminophenol from a viewpoint of its reactivity.

The amount of the repeating unit (3) in the liquid-crystalline polyester may be in the range of from 35 to 10% by mol, is preferably from 30 to 15% by mol, and is more preferably from 27.5 to 17.5% by mol, with respect to the total repeating units of the polyester. When the amount of the repeating unit (3) is larger than the above upper limit, the liquid crystallinity of the polyester tends to decrease. When the amount of the repeating unit (3) is smaller than the above lower limit, the solubility of the polyester in the solvent described later tends to decrease.

When the liquid-crystalline polyester with repeating units (1)–(3) is produced, the raw material corresponding to repeating unit (2) is used in the amount equal to that of the raw material corresponding to repeating unit (2) so that the repeating units (2) and (3) are present in the resulting polyester in approximately the equal amounts. Alternatively, the raw material corresponding to repeating unit (3) may be used in the amount smaller or larger by 10% by weight than that of the raw material corresponding to repeating unit (2), or in the amount therebetween. In this case, a polymerization degree of the resulting liquid-crystalline polyester may be controlled.

The method for producing the aromatic liquid-crystalline polyester used in the present invention is not particularly limited. Examples of the method include a method in which a phenolic hydroxyl group or an amino group included in aromatic hydroxycarboxylic acid corresponding to the repeating unit (1), or aromatic amine having a phenolic hydroxyl group or aromatic diamine, those which correspond to the repeating unit (3), is acylated with an aliphatic carboxylic anhydride to obtain an acylated compound, and the acylated compound and the aromatic dicarboxylic acid corresponding to the repeating unit (2) are subjected to transesterifying or transamidating (polycondensing) therebetween, followed by melt polymerization.

In the acylating reaction, the amount of the aliphatic carboxylic anhydride be used is preferably from 1 to 1.2 equivalents, more preferably from 1.05 to 1.1 equivalents, per one equivalent of the total of the phenolic hydroxyl group and the amino group. When the amount of the carboxylic anhydride is smaller than the above lower limit, the acylated compound and the aromatic hydroxycarboxylic acid, the aromatic dicarboxylic acid, etc. tend to sublimate during transesterification or transamidation (polycondensation) so that a reaction system may be clogged. When the amount of the carboxylic anhydride is larger than the above upper limit, the resulting liquid-crystalline polyester tends to be noticeably colored.

The acylating reaction is preferably conducted at a temperature of 130 to 180° C. for 5 minutes to 10 hours, more preferably at a temperature of 140 to 160° C. for 10 minutes to 3 hours.

The kind of the carboxylic anhydride used for the acylation is not particularly limited. Examples of the carboxylic anhydride include acetic anhydride, propionic anhydride, butyric anhydride, isobutyric anhydride, valeric anhydride, pivalic anhydride, 2-ethylhexanoic anhydride, monochloroacetic anhydride, dichloroacetic anhydride, trichloroacetic anhydride, monobromoacetic anhydride, dibromoacetic anhydride, tribromoacetic anhydride, monofluoroacetic anhydride, difluoroacetic anhydride, trifluoroacetic anhydride, glutaric anhydride, maleic anhydride, succinic anhydride, and β-bromopropionic anhydride. These anhydrides may be used independently or in admixture of two or more of them. Among them, acetic anhydride, propionic anhydride, butyric anhydride and isobutyric anhydride are preferable from a viewpoint of their cost and handling properties. More preferably, acetic anhydride is used.

In the transesterification or transamidation (polycondensation), the acylated compound is preferably used in such an amount that the equivalent of the acyl group is 0.8 to 1.2 equivalent per one equivalent of the carboxyl group.

The transesterification or transamidation (polycondensation) is preferably conducted in a temperature range between 130 to 400° C., while raising the reaction temperature at a rate of 0.1 to 50° C./min, and more preferably in a temperature range between 150 to 350° C., while raising the reaction temperature at a rate of 0.3 to 5° C./min.

In the transesterification or transamidation (polycondensation), the unreacted carboxylic anhydride and by-produced carboxylic acids are preferably removed from the reaction system by, for example, evaporation to shift the equilibrium of the reaction to the product side.

The acylation, and/or the transesterification or transamidation (polycondensation) may be conducted in the presence of a catalyst. The catalyst may be conventional catalyst which has previously been known as a catalyst for polymerizing polyester. Examples of the include a metal salt catalyst (e.g., magnesium acetate, stannous acetate, tetrabutyl titanate, lead acetate, sodium acetate, potassium acetate and antimony trioxide) and an organic compound catalyst such as a heterocyclic compound containing two or more nitrogen atoms (e.g., N,N-dimethylaminopyridine and N-methylimidazole).

Among these catalysts, the heterocyclic compound containing two or more nitrogen atoms such as N,N-dimethylaminopyridine and N-methylimidazole is preferably used (see, JP-A No. 2002-146003).

The catalyst may be placed in a reactor when the monomers are placed in the reactor. The catalyst used in the acylation may not necessarily be removed. Even when the catalyst is not removed, transesterification or transamidation (polycondensation) may be conducted using the reaction mixture obtained by the acylation.

The polycondensation by transesterification or transamidation may be conducted by melt-polymerization, which may be followed by solid-phase polymerization. When the solid-phase polymerization is conducted, the polymer from the melt polymerization is preferably milled to obtain the powder-form or flake-form polymer, which may be then subjected to the conventional solid-phase polymerization. For example, the polymer in the solid state from the melt-polymerization is heated in an atmosphere of an inert gas such as nitrogen at a temperature of from 20 to 350° C. for 1 to 30 hours. The solid-phase polymerization may be conducted with or without agitating the polymer. By utilizing a reactor equipped with an appropriate agitation mechanism, the melt polymerization and the solid-phase polymerization both can be carried out in the same reactor. After the solid-phase polymerization, the resulting liquid-crystalline polyester may be pelletized in a conventional manner and then molded or shaped.

The liquid-crystalline polyester may be produced batchwise or continuously.

As long as the effects of the liquid-crystalline polyester are not deteriorated, at least one kind of polymer (including polyester) other than the above-mentioned polyester may be used together with the above-mentioned polyester. Examples of such a polymer include a thermoplastic resin such as polypropylene, polyamide, polyester, polyphenylene sulfide, polyether ketone, polycarbonate, polyether sulfone, polyphenyl ether and a modified product thereof, and polyetherimide; and an elastomer such as a copolymer of glycidyl methacrylate and ethylene.

An aromatic liquid-crystalline polyester solution used in the present invention contains an aprotonic solvent. The amount of the aprotonic solvent to be used is not particularly limited as long as the liquid-crystalline polyester can be dissolved therein, and can be appropriately decided depending on the applications of the polyester solution. For example, the aromatic liquid-crystalline polyester solution may be prepared to have a concentration of the polyester such that the solution contains 0.1 to 100 parts by weight of the aromatic liquid-crystalline polyester with respect to 100 parts by weight of the aprotonic liquid. When the concentration of the liquid-crystalline polyester is lower than the above lower limit, it may be difficult for the polyester to be impregnated in a sheet comprising an aromatic liquid-crystalline polyester fiber. On the other hand, when the concentration is larger than the above upper limit, the viscosity of the solution tends to increase. From a viewpoint of workability and economy, the aromatic liquid-crystalline polyester solution is prepared so that the liquid-crystalline polyester is preferably contained in the amount of 1 to 50 parts by weight, more preferably 2 to 40 parts by weight, with respect to 100 parts by weight of the aprotonic liquid.

Example of the aprotonic solvent include halogen-containing solvents such as 1-chlorobutane, chlorobenzene, 1,1-dichloroethane, 1,2-dichloroethane, chloroform and 1,1,2,2-tetrachloroethane; ether solvents such as diethyl ether, tetrahydrofuran and 1,4-dioxane; ketone solvents such as acetone and cyclohexanone; ester solvents such as ethyl acetate; lactone solvents such as γ-butyrolactone; carbonate solvents such as ethylene carbonate and propylene carbonate; amine solvents such as triethylamine and pyridine; nitrile solvents such as acetonitrile and succinonitrile; amide solvents such as N,N'-dimethylformamide, N,N'-dimethylacetamide, tetramethylurea and N-methylpyrrolidone; nitro solvents such as nitromethane and nitrobenzene; sulfide solvents such as dimethyl sulfoxide and sulfolane; and phosphoric acid solvents such as hexamethylphosphoric acid amide and tri-n-butylphosphoric acid.

Among them, a solvent containing no halogen atom is preferably used from a viewpoint of influence of the environment, and a solvent having a dipolar moment of not less than 3 and not more than 5 is preferably used from a viewpoint of solubility. Specifically, preferable solvents include amide solvents such as N,N'-dimethylformamide, N,N'-dimethylacetamide, tetramethylurea and N-methylpyrrolidone; and lactone solvents such as γ-butyrolactone. More preferable solvents include N,N'-dimethylformamide, N,N'-dimethylacetamide and N-methylpyrrolidone.

An aromatic liquid-crystalline polyester solution used in the present invention can be obtained by dissolving the aforementioned liquid-crystalline polyester in the aforementioned solvent. It is preferred to remove a fine foreign matter, if any contained in the resulting solution, by filtration with a filter or the like, if necessary.

As long as the properties of the aromatic liquid-crystalline polyester solution used in the present invention are not deteriorated, one or more kinds of optional additives can be contained in the polyester solution. Examples of the optional additives include inorganic fillers such as silica, aluminum hydroxide and potassium hydroxide; organic fillers such as cured epoxy resin, crosslinked benzoguanamine resin and crosslinked acryl polymer; thermosetting resins such as a phenol resin, an epoxy resin, a polyimide resin and cyanate resin; and other various additives such as a silane coupling agent, an antioxidant and ultraviolet-ray absorbing agent.

In the present invention, a resin-impregnated substrate may be obtained by immersing a sheet comprising an aromatic liquid-crystalline polyester fiber in the above-described aromatic liquid-crystalline polyester solution, and then removing the solvent.

Examples of the sheet comprising an aromatic liquid-crystalline polyester fiber include a textile (woven fabric), a knitted cross, non-woven cross, and the like made of an aromatic liquid-crystalline polyester fiber. The non-woven cross may be produced by a dry process or a wet process.

An aromatic liquid-crystalline polyesterwhich can be used for preparing the aromatic liquid-crystalline polyester fiber is not particularly limited, and may be a polyester obtained by polymerizing aromatic diol, aromatic dicarboxylic acid aromatic hydroxycarboxylic acid, an aromatic diamine or an aromatic amine with a phenolic hydroxyl group, or an appropriate combination of them.

The resin-impregnated substrate, which can be obtained by immersing the sheet in the above-described aromatic liquid-crystalline polyester solution, and removing the solvent, may a sheet thickness of from about 30 to 200 µm, after the removal of the solvent.

The step of removing the solvent is not particularly limited, and may be conducted by evaporating the solvent. Examples of the evaporation include the method by heating, reduction in a pressure, ventilation and the like.

The resulting resin-impregnated substrate may be subjected to heat treatment, if necessary.

Thus obtained resin-impregnated substrate may be used alone, or may be used by laminating other sheet, film (membrane) or the like. Such other sheet or the like may be made from a metal or a resin.

The method of the lamination of other sheet or the like is not particularly limited. Examples thereof include a method of adhering other sheet or the like to the resin-impregnated substrate with an adhesive; and a method of thermal fusing other sheet or the like and the resin-impregnated substrate by heat pressing.

The resin-impregnated substrate in the present invention is preferably used together with a conductive layer, in which at least one conductive layer is placed on one side or both sides of the resin-impregnated substrate. The conductive layer may be placed onto the substrate by a method of laminating a metal foil on the substrate using an adhesive, a method of heat fusing the conductive layer and the substrate with a heat press, a method of coating a metal powder or particle onto the substrate (e.g., a plating method, a screen printing method and a sputtering method) or the like. The conductive layer may be made from a metal such as copper, aluminum and silver. From a viewpoint of conductivity and cost, copper is preferable.

The resin-impregnated substrate with at least one conductive layer, which comprises the resin-impregnated substrate and at least one conductive layer placed on at least one side of the substrate, can be used as a printed circuit board or a packaging substrate. For the purpose of protecting an electrically conductive layer, a cover film may be further laminated on the printed circuit board.

As described above, in accordance with the present invention, a resin-impregnated substrate having high solder heat resistance and a small linear expansion rate is provided. The resin-impregnated substrate obtained in the present invention is suitable as an insulating resin substrate having a small dielectric loss tangent even in a high frequency (such as 100 MHz or larger). The resin-impregnated substrate with a conductive layer thereon in the present invention has a small linear expansion rate in addition to high heat resistance, and therefore, the substrate can be suitably used in a printed circuit board or a packaging substrate.

The invention being thus described, it will be apparent that the same may be varied in many ways. Such variations are to be regarded as within the spirit and scope of the invention, and all such modifications as would be apparent to one skilled in the art are intended to be within the scope of the following claims.

The entire disclosure of the Japanese Patent Application No. 2004-176521 filed on Jun. 15, 2004, including specification, claims and summary, are incorporated herein by reference in their entirety.

EXAMPLES

The present invention is described in more detail by following Examples, which should not be construed as a limitation upon the scope of the present invention.

Example 1

(1) Preparation of Aromatic Liquid-crystalline Polyester:

A reactor equipped with a stirring apparatus, a torque meter, a nitrogen gas introducing tube, a thermometer and a refluxing condenser was charged with 941 g (5.0 mol) of 2-hydroxy-6-naphthoic acid, 273 g (2.5 mol) of 4-aminophenol, 415.3 g (2.5 mol) of isophthalic acid and 1123 g (11 mol) of acetic anhydride. After the interior of the reactor was sufficiently replaced with a nitrogen gas, the resulting mixture was heated to 150° C. over 15 minutes under a nitrogen gas stream, followed by refluxing for 3 hours while maintaining the temperature.

Thereafter, the mixture was further heated to 300° C. over 150 minutes while distilling off effluent by-product acetic acid and unreacted acetic anhydride. When a torque of the mixture was increased, the mixture was discharged from the reactor. The mixture was cooled to room temperature, and was milled with a grinding machine. After that, the mixture was heated to 200° C. for 1 hour under a nitrogen atmosphere, and then, was further heated to 250° C. The temperature of 250° C. was maintained for 3 hours, to conduct a solid-phase polymerization thereof. The resulting solid matter was cooled to room temperature, and was milled with a grinding machine. After that, the mixture was heated to 180° C. for 1 hour under a nitrogen atmosphere, and then, was further heated to 250° C. The temperature of 250° C. was maintained for 3 hours, to further conduct a solid-phase polymerization thereof and obtain a liquid-crystalline polyester powder. The resulting powder exhibited a schlieren pattern, peculiar to a liquid-crystalline phase, at 370° C. under observation with a polarizing microscope.

(2) Preparation of Aromatic Liquid-crystalline Polyester Solution:

The liquid-crystalline polyester powder (8 g) obtained above in step (1) of Example 1 was added to and dissolved in 92 g of N-methylpyrrolidone as a solvent, while the resulting mixture was heated to 160° C. The mixture was then cooled to room temperature to obtain an aromatic liquid-crystalline polyester solution.

(3) Preparation of Resin-impregnated Substrate:

A non-woven cross comprising an aromatic liquid-crystalline polyester fiber (non-woven cross HBBK22FX, manufactured by Kuraray Co., Ltd.; thickness 50 μm) was immersed in the aromatic liquid-crystalline polyester solution obtained in the above step (2) of Example 1, and was heated with a hot plate having a set temperature of 100° C. for 1 hour, to evaporate the solvent.

Thereafter, heat treatment was conducted with a hot air dryer at 300° C. for 1 hour, to obtain an aromatic liquid-crystalline polyester resin-impregnated substrate having a thickness of 90 μm. A dielectric loss tangent of the substrate was measured using an impedance analyzer (manufactured by HP). The dielectric loss tangent was found to be 0.0031 (1 GHz).

(4) Evaluation of Resin-impregnated Substrate:

The aromatic liquid-crystalline polyester resin-impregnated substrate was immersed in a solder bath at a temperature of 280° C. for 1 minute, and the surface state thereof was observed. Neither deformation nor swelling of the resin-impregnated substrate was seen.

Using another resin-impregnated substrate obtained in the same manner as above, a linear expansion rate thereof in a planar direction was measured with a TMA apparatus (manufactured by Rigaku Corporation). The linear expansion rate in a planar direction was found to be 15 ppm/°C. (at a temperature of from 50 to 100° C.).

Comparative Example 1

A sheet in which a glass cross has been impregnated with an epoxy resin (FR-4, manufactured by Hitachi Chemical Co., Ltd.; thickness 800 μm) was immersed in a solder bath at a temperature of 280° C. for 1 minute, and the surface state thereof was observed. As a result, a portion of the sheet was thermally deteriorated, and deformation of the substrate was also seen. A dielectric loss tangent of the same sheet as above, FR-4, was measured using an impendence analyzer (manufactured by HP) and was found to be 0.012 (1 GHz).

What is claimed is:

1. A resin-impregnated substrate obtainable by a method comprising the steps of:
    immersing a sheet comprising an aromatic liquid-crystalline polyester fiber in an aromatic liquid-crystalline polyester solution containing an aprotonic solvent and a liquid-crystalline polyester comprising 10 to 35% by mol, with respect to the total repeating units of the polyester, of at least one repeating unit selected from the group consisting of a repeating unit derived from an aromatic diamine and a repeating unit derived from an aromatic amine with a phenolic hydroxyl group; and
    removing the solvent.

2. A resin-impregnated substrate according to claim 1, wherein the aprotonic solvent is a solvent containing no halogen atom.

3. A resin-impregnated substrate according to claim 2, wherein the aprotonic solvent is a solvent having a dipolar moment of not less than 3 and not more than 5.

4. A resin-impregnated substrate with a conductive layer, which comprises the resin-impregnated substrate according to claim 1 and at least one conductive layer placed on at least one side of the substrate.

* * * * *